United States Patent [19]

Edamura et al.

[11] Patent Number: 4,478,703

[45] Date of Patent: Oct. 23, 1984

[54] SPUTTERING SYSTEM

[75] Inventors: Mizuo Edamura, Kobe; Takashi Kajikawa, Miki; Koji Okamoto, Akashi, all of Japan

[73] Assignee: Kawasaki Jukogyo Kabushiki Kaisha, Japan

[21] Appl. No.: 594,577

[22] Filed: Mar. 29, 1984

[30] Foreign Application Priority Data

Mar. 31, 1983 [JP] Japan .......................... 58-55418
Mar. 31, 1983 [JP] Japan .......................... 58-46924

[51] Int. Cl.$^3$ ............................................. C23C 15/00
[52] U.S. Cl. .................................. 204/298; 204/192 R
[58] Field of Search ........................... 204/298, 192 R

[56] References Cited

U.S. PATENT DOCUMENTS 4,022,939  5/1977  Roth et al. ........................... 204/298
4,113,082  9/1978  Timin ................................. 204/298
4,147,573  4/1979  Morimoto ........................... 204/298
4,170,541 10/1979  Lamont .............................. 204/298
4,230,515 10/1980  Zajac ................................. 204/298

Primary Examiner—Arthur P. Demers

[57]  ABSTRACT

A sputtering system including a workpiece and at least one target located in a vacuum reaction furnace, wherein a magnetic field is generated between the workpiece and the target and a electric field perpendicular to the magnetic field generated between the workpiece and the target is additionally generated. A plurality of targets may be located around the workpiece and either the workpiece or the targets may be rotated when the magnetron discharge is generated.

3 Claims, 7 Drawing Figures

SPUTTERING SYSTEM

BACKGROUND OF THE INVENTION

This invention relates to a sputtering system for applying to the surface of an objective to be treated a thin film of uniform thickness of a metal or an alloy of discimilar metals with a high degree of productivity.

Generally, sputtering is a process for depositing a thin film of a metal on to a surface in which metallic atoms are sputtered from the cathode by the impact of positive ions when a glow discharge is set up and coated on the surface of an objective located in the vicinity of the anode. A sputtering system utilizing this phenomenon is known as from Japanese Patent Publication No. Sho 56-54392.

A sputtering system of the prior art in which an objective to be treated (hereinafter workpiece) is located outside a target has suffered the disadvantage that difficulties are experienced in achieving a high degree of uniformity in the thickness of a film applied by sputtering because the amount of material deposited on a portion of the surface facing the target is large but the amount of material deposited on a portion of the surface opposite the target is small. This problem might be solved by rotating a workpiece. However, even if the workpiece is rotated, the amount of material deposited is reduced when the surface of the rotating workpiece is not disposed in a position in which it directly faces the target because the metallic atoms fly in one direction. Thus, the deposition rate of film decreases and the forming efficiency of the film by sputtering is reduced.

When it is desired to apply to the surface of a workpiece a thin film of a metal, such as titanium, chromium, silicon, boron, tantalum, zirconium, etc., or a alloy of over two of these metals composed of a nitride, carbide, or oxide thereof, the end can be attained by using a target of complex composition constituted by all the components of the alloy. However, the use of such target of complex composition raises the problem that production cost is high. Moreover, the problems that the system is unable to achieve a uniform thickness in the applied film and low in sputtering efficiency remain unsolved.

A sputtering system is known in which a magnetic field is utilized to trap electrons near the target therein to improve discharging efficiency and produce plasma of high density to accelerate film formation, and in which magnetron discharge is utilized to inhibit a rise in the temperature of a workpiece (substrate). However, this system has suffered the disadvantage that, when the workpiece is formed beforehand with a first hardened material layer by nitriding treatment and then a second hardened material layer (thin film) is formed by sputtering treatment, the surface of the first hardened material layer might be oxidized before the second hardened material layer (thin film) is formed or air or gas might be trapped between the two hardened material layers, thereby preventing the hardened material layers intimately adhering to each other with high bonding strength.

Proposals have been made to avoid this disadvantage by carrying out ion nitriding and sputtering continuously in the same vacuum reaction furnace. In this case, when ion nitriding is performed, a glow discharge is set up by applying a DC voltage between a workpiece serving the cathode and furnace wall or target serving as the anode. Stated differently, reverse sputtering is performed in which the direction in which a DC voltage is impressed is opposite the direction in which a DC voltage is impressed when sputtering is performed. When a DC voltage is applied in a direction opposite the direction in which it is applied in performing sputtering, the treating temperature should be kept at about 500°-570° C. When a rise in temperature is effected merely by relying on glow discharge, the power with which a glow discharge is set up or the value of a discharge current should be increased in value if the workpiece has a large surface area. When the workpiece is complex in shape, or when a large number of workpieces are treated, the glow discharge would become unstable because of a large arc discharges involved. Particularly, when the workpiece is of complex shape, the temperature distribution on the surface thereof might become noneven, and it would be impossible to provide a nitride layer of a uniform thickness.

SUMMARY OF THE INVENTION

An object of this invention is to provide a sputtering system capable of causing a thin film of uniform thickness to be deposited on the entire area of a surface of a workpiece with a high degree of efficiency.

Another object is to provide a sputtering system capable of applying a metallic film with uniform thickness readily, with a high degree of efficiency, at a low cost and without using a composite target to the entire area of a surface of a workpiece, irrespective of whether the metallic film is composed of a metal, dissimilar metals or an alloy of nitride, carbide or oxide thereof.

Still another object is to provide a magnetron sputtering system comprising glow discharge setting up means which uses a target or a wall of a vacuum reaction furnace as an anode and a workpiece as a cathode, sputtering means which uses the workpiece as an anode and the target as a cathode, and a heater for heating the workpiece. In this sputtering system, a rise in temperature is readily achieved by heating the workpiece by the heater and the discharge set up can be stabilized by reducing the power of the glow discharge, to thereby obtain an even temperature distribution on the surface of the workpiece.

Additional and other objects, features and advantages of the invention will become apparent from the description set forth hereinafter when considered in conjunction with the accompanying drawings.

DESCRIPTION OF THE PREFERRED EMBODIMENTS

Figure 1:
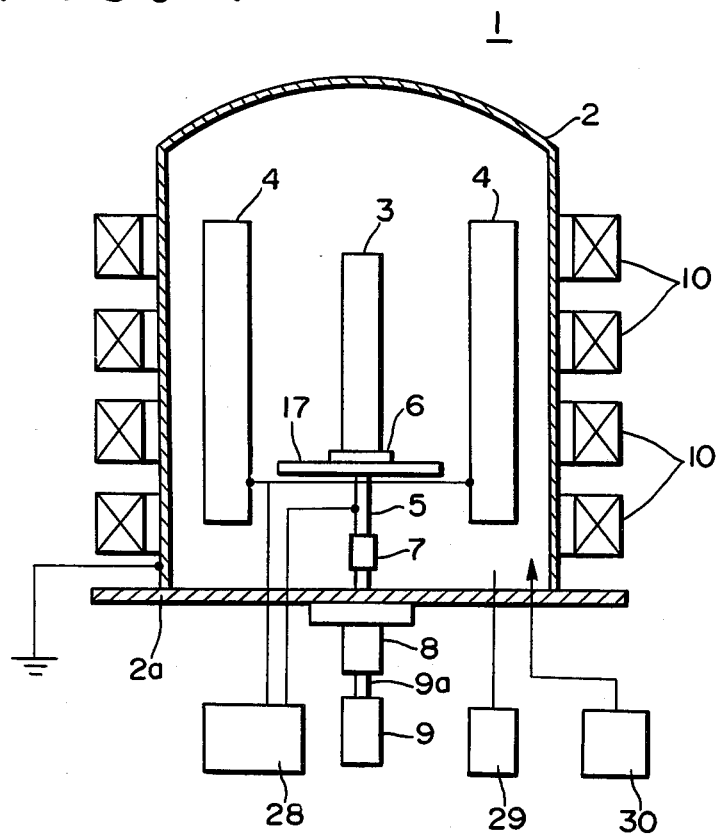
FIG. 1 is a schematic view of the sputtering apparatus comprising one embodiment of the invention.
Figure 2:
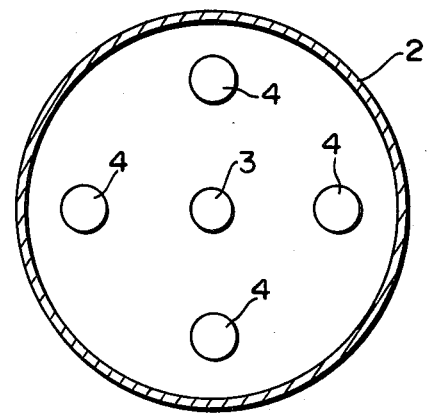
FIG. 2 is a view in explanation of the positional relation between the workpiece and the targets.

Referring to FIGS. 1 and 2, a sputtering system of the magnetron type is generally designated by the reference numeral 1 and comprises a furnace 2 in which a workpiece 3 is located substantially in a central portion, and a plurality of targets 4 (which is four in number in the embodiment shown and described herein) are located outside the workpiece 3 along the circumference of an imaginary circle and spaced apart equidistantly from each other and a predetermined distance from the workpiece 3. The targets 4 are formed of dissimilar metals which may include titanium, chromium, boron and silicon, for example.

The workpiece 3 which is placed on a table 6 connected to a rotary shaft 5 is rotated relative to the targets 4 as the rotary shaft 5 connected to a motor 9 located outside the furnace 2 through an insulator 7 and a magnetic seal 8 is rotated by the motor 9.

The targets 4 located equidistantly from the workpiece 3 each have a magnetic field generating member mounted therein, as subsequently to be described. Magnetic coils 10 are located at an outer periphery of the furnace 2 to cooperate with the magnetic field generating members in the targets 4 to generate magnetic fields which are at right angles to the magnetic fields generated between the targets 4 and workpiece 3.

Figure 3:
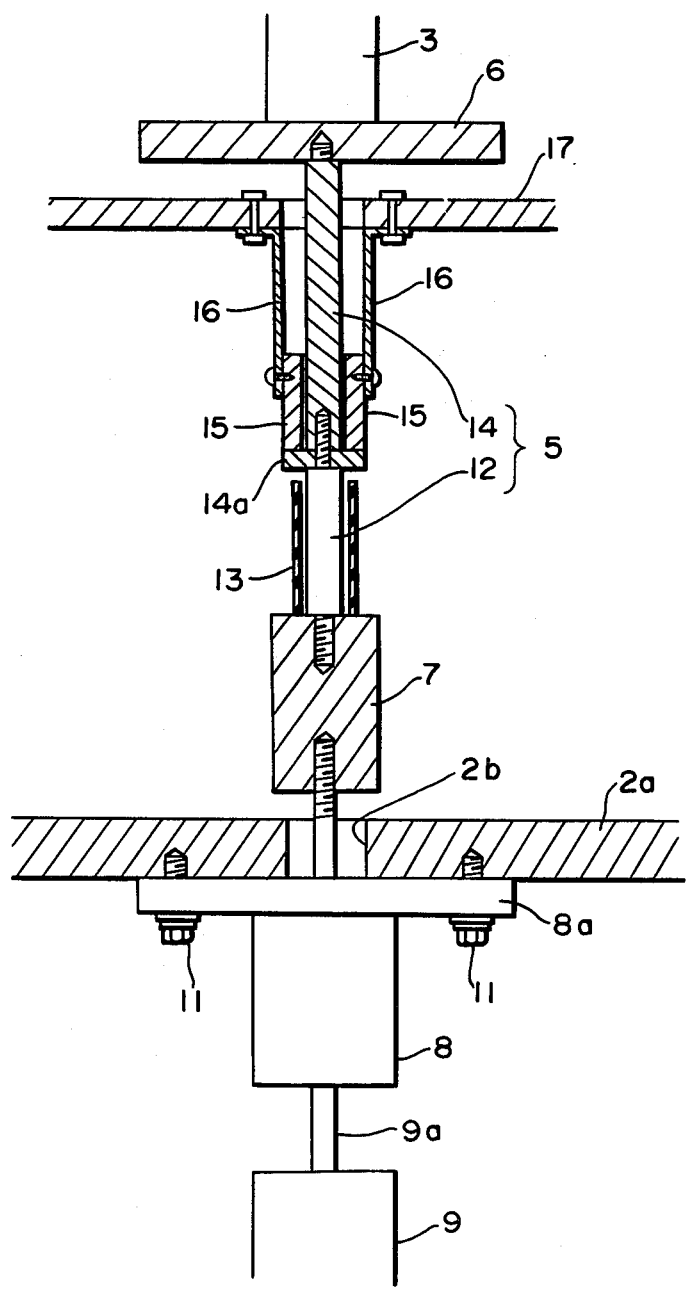
FIG. 3 is a sectional view showing in detail the mechanism for rotating the workpiece.

FIG. 3 shows in detail the mechanism for rotating the workpiece 3, in which the motor 9 for rotating the workpiece 3 has an output shaft 9a which extends through the magnetic seal 8 secured at a flange 8a by bolts 11 to a lower furnace wall 2a of the furnace 2, into an aperture 2a formed at the lower furnace wall 2a, to be threadably connected to a lower end portion of the insulator 7. A lower rotary shaft 12 is threadably connected to an upper end portion of the insulator 7 concentrically with the output shaft 9a of the motor 9, and a cylindrical insulator 13 extends upwardly from the insulator 7 so that the lower rotary shaft 12 is located in the hollow interior of the cylindrical insulator 13.

An upper rotary shaft 14 is threadably connected to a lower end portion 14a of the upper rotary member 14 concentrically with the lower rotary shaft 12, and an upper end portion of the upper rotary shaft 14 is threadably connected to the table 6 on which the workpiece 3 is placed.

An electrode terminal 15 in contact with a top surface of the upper rotary shaft 14 is secured to a base plate 17 by a mounting fixture 16. As the lower end portion 14a of the upper rotary shaft 14 and the electrode terminal 15 are in contact with each other, an electric current is introduced to the rotary shaft 14 and hence to the table 6 for supporting the workpiece 3.

Figure 4:
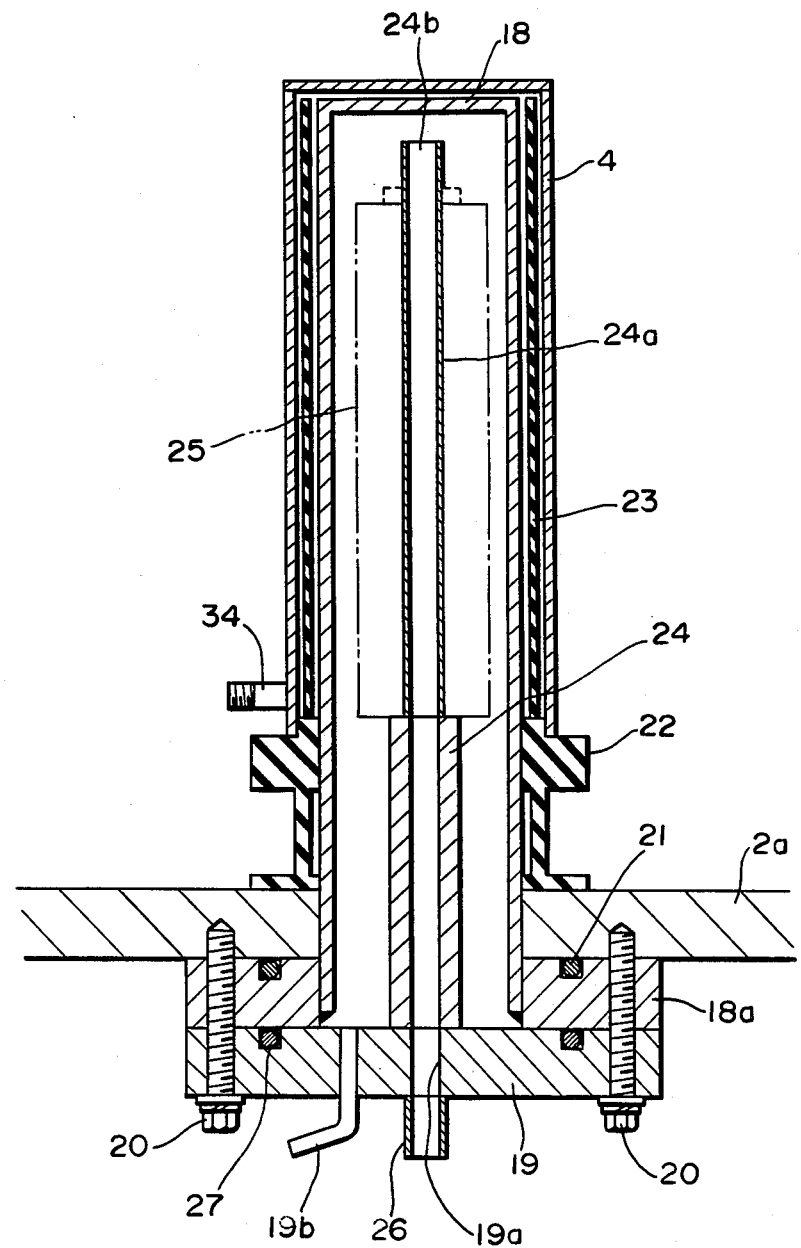
FIG. 4 is a sectional view showing in detail the mechanism for cooling the targets.

In FIG. 4 showing in detail the cooling mechanism for the targets 4, a cylindrical housing 18 having a flange 18a extends through the lower furnace wall 2a from below. The flange 18a is secured together with a support plate 19 to a bottom surface of the lower furnace wall 2a by bolts 20. An O-ring 21 is interposed between the flange 18a and lower furnace wall 2a to provide a vacuum seal.

Located below an outer periphery of the cylindrical housing 18 and on a top surface of the lower furnace wall 2a is a support member 22 formed of an insulating material, such as alumina, which supports thereon a cylindrical member 23 formed of an insulating material, such as alumina. Each of the targets 4 which are cylindrical in shape is mounted on the support member 22 in a manner to enclose the cylindrical member 23.

Located in the cylindrical housing 18 is the magnetic field generating member 25 fitted over a reduced diameter portion 24a of a cooling tube 24 secured at its lower end to the support plate 19. The cooling water tube 24 is maintained, through its lower open end and via an aperture 19a formed at the support plate 19, in communication with a cooling water supply tube 26 secured to the support plate 19. Cooling water supplied through the cooling water supply tube 26 flows through the cooling water tube 24 and an upper opening 24b thereof to outside. Then, the cooling water flows through the housing 18 and is discharged through a discharge duct 19a connected to the support plate 19 to outside. As the cooling water flows through the passage described hereinabove, the target 4 is cooled and the magnetic field generating member 25 is also cooled to avoid demagnetization that might otherwise be caused to occur by heat produced by a discharge that is set up. A liquid-tight seal is provided by a seal 27 between the flange 18a and support plate 19. The magnetic field generating member 25 is of known type which may include a permanent magent. An electrode terminal 34 is connected to each target 4.

Referring to FIG. 1 again, the numerals 28, 29 and 30 designate a DC current source, a vacuum pump and an atmosphere gas supply source for supplying an atmosphere gas, such as $N_2$ gas, inert gas, etc., to the interior of the furnace 2, respectively.

In the sputtering system of the aforesaid construction, the motor 9 is actuated to rotate the workpiece 3 at a speed of about 20–30 rpm. in a reaction gas atmosphere, such as argon gas or other inert gas, $N_2$ gas, etc., and a DC voltage is impressed between each target 4 serving as a cathode and the workpiece 3 serving as an anode, to subject the workpiece 3 to sputtering treatment. Metallic atoms sputtered from the targets 4 formed of dissimilar metals, such as titanium, silicon, boron and chromium, are deposited on to a surface of the workpiece 3 in a molten state.

Thus, a film of an alloy is formed on the surface of the workpiece 3. In this case, since the workpiece 3 is rotating, the metallic atoms are deposited evenly on the surface of the workpiece 3 and the film of the alloy is applied to the surface of the workpiece 3 with a high degree of efficiency, enabling uniform thickness to be achieved in the coat on the entire area.

Figure 5:
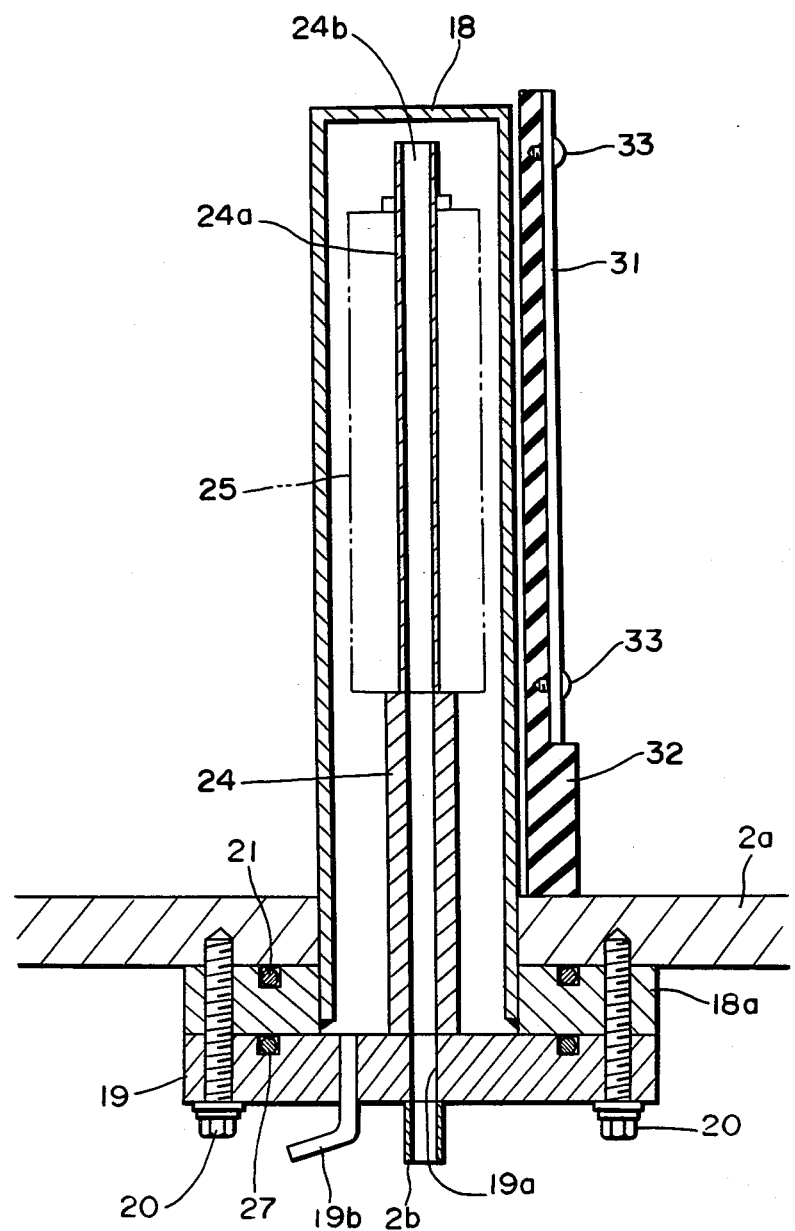
FIG. 5 is a view similar to FIG. 4 but showing a modification of the mechanism for cooling the targets.

In the embodiment shown and described hereinabove, the targets 4 are described as being cylindrical in shape. However, the invention is not limited to this specific shape of the targets 4, and the targets 4 may be each in the form of a plate as shown in FIG. 5. In this case, a mounting table 32 formed of an insulating material, such as alumina, located between the cylindrical housing 18 and the workpiece 3 in an upright position is supported on the lower surface wall 2a, and a target 31 is mounted on the mounting table 32 by a screw 33. In the respects, the target 31 is similar in construction to the target 4 shown in FIG. 4.

In the embodiment shown and described hereinabove, the workpiece 3 is described as being rotated. However, this is not restrictive and the targets may be connected to the rotating mechanism to rotate the former by the latter with the workpiece 3 remaining stationary in the center of the targets 4 arranged on the circumference of an imaginary circle centered at the workpiece 3.

In the embodiment shown and described hereinabove, the targets 4 are described as being formed of dissimilar metals to deposit a film of an alloy of the dissimilar metals on the surface of the workpiece. However, it is possible to deposit a film of a metal of uniform thickness on the surface of the workpiece even if sputtering is performed by forming the targets with one metal, so long as either the workpiece or targets are rotated. Since the entire area of the surface of the workpiece at all times the direction from which the metallic atoms are sputtered, the efficiency with which sputtering is performed can be improved. In the embodiment shown and described hereinabove, the invention is incorporated in a magnetron type sputtering system. The invention is not limited to this specific type of sputtering system and may be incorporated in any type of sputtering system, such as a high frequency type, ion beam type, etc.

From the foregoing description, it will be appreciated that the invention allows uniform thickness to be achieved readily with a high degree of efficiency and productivity in a film of one metal or an alloy of dissimilar metals deposited on the surface of a workpiece by sputtering. Thus, the invention has a very high practical value.

Figure 6:
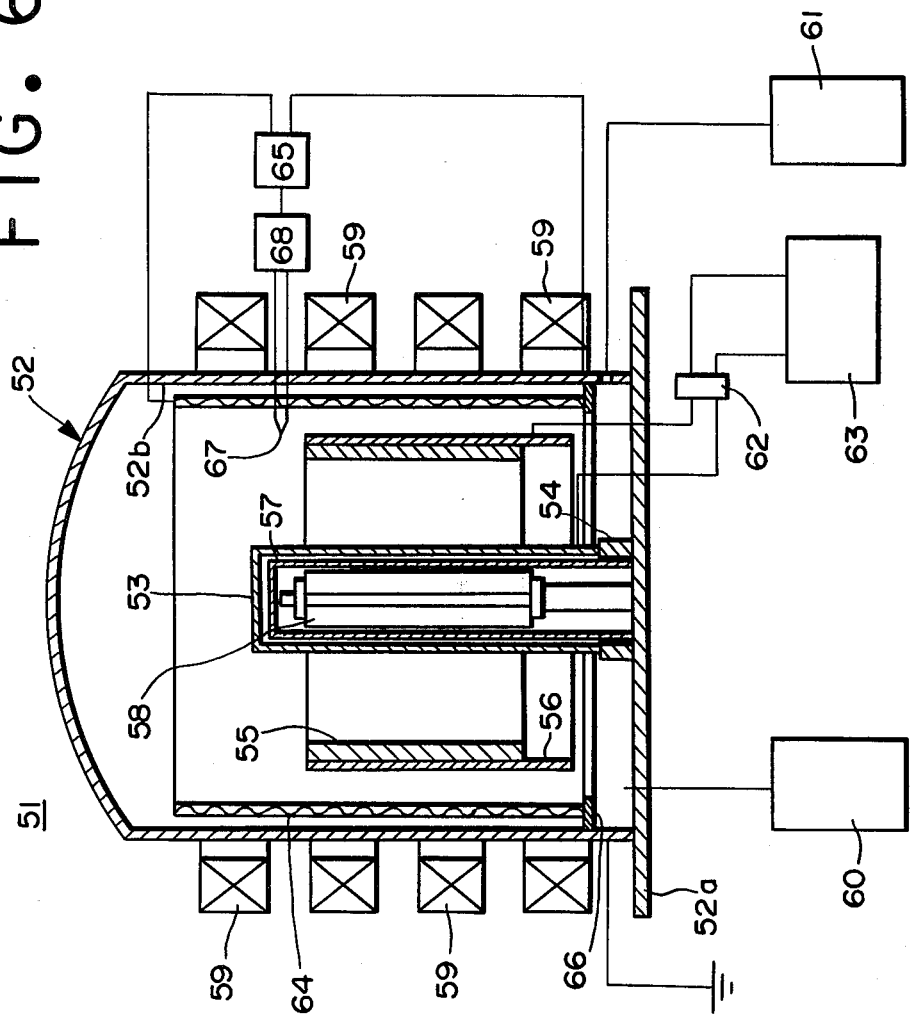
FIG. 6 is a schematic view of the sputtering apparatus comprising another embodiment.

FIG. 6 shows another embodiment of the invention incorporated in a magnetron type sputtering system generally designated by the reference numeral 51 which comprises a vacuum reaction furnace 32 including a base 52a at its bottom and a furnace body 52b supported on the base 52a. A target 53 of a cylindrical shape is located in a central portion of the vacuum reaction furnace 52 on an insulating member 54, and a workpiece 55 is mounted around the target 53 through an electrode member 56. Although not shown, the electrode member 56 is supported on an insulator so that the target 53 is insulated from the electrode member 56 and the vacuum reaction furnace 52.

A permanent magnet 58 is contained in a cylindrical housing 57 enclosed by the target 53, and electromagnets 59 are located on an outer periphery of the vacuum reaction furnace 52. The permanent magnet 58 and electromagnets 59 constitute magnetic field generating means. Evacuating means 60 including a vacuum pump, not shown, for creating a desired vacuum in the interior of the vacuum reaction furnace 52, and gas introducing means 61 for introducing a treating gas, such as argon gas, $H_2$ gas, $N_2$ gas, etc., to the interior of the vacuum furnace 52 are connected to the vacuum reaction furnace 52.

The target 53 and electrode merber 56 are connected to a DC power source 63 through a polarity converter 62 for switching the target 53 and the electrode member 56 between the anode and the cathode for applying a voltage to set up a discharge. Thus, by the action of the polarity converter 62, glow discharge setting up means using the target 53 as the anode and the electrode member 56 or workpiece 55 as the cathode and the sputtering means using the target 53 as the cathode and the workpiece 55 as the anode can be provided.

A heater 54 is located inside the vacuum reaction furnace 52 and mounted along an inner wall surface of the furnace body 52b, and an AC power source 65 is connected to the heater 64 which may be in the form of a graphite cloth heater or sheated heater covered with a heat insulsting material connected to the furnace body 52b through a support member 66. The AC power source 65 has connected thereto a temperature control unit 68 including a thermocouple 67 for measuring temperature located in the interior of the vacuum reaction furnace 52.

The target 53 is formed of a sputtered material, such as titanium, tantalum, chromium, zirconium, silicon, etc., or a sputtered material is applied to its outer peripheral surface. The workpiece 55 may be a metal mold of a different type, a cutting tool, a heat insulating member, a wear resisting member, etc., formed of steel, such as SKD 61, SS 41, (J.I.S. specification) cast steal, etc.

Although not shown, the vacuum reaction furnace 52 and target 53 may be cooled by cooling water.

Figure 7:
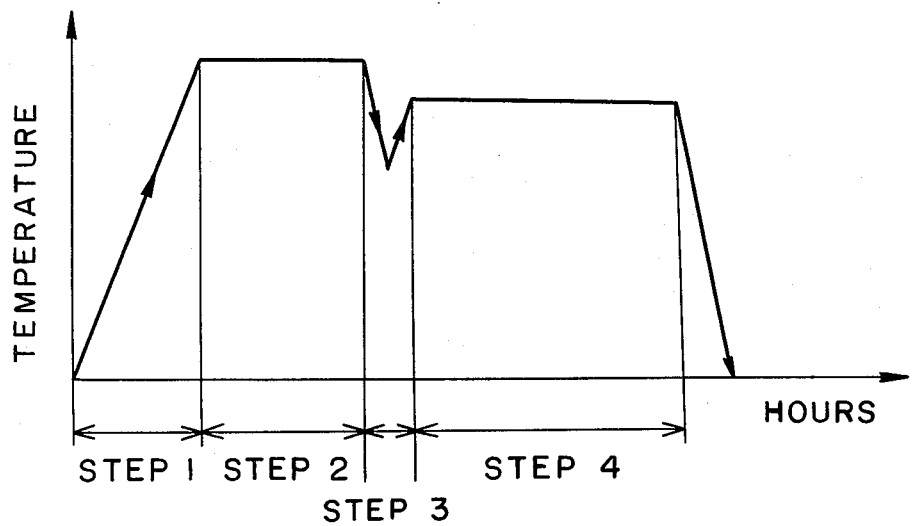
FIG. 7 is a diagrammatic representation of the relation between temperature and time with respect to one treating cycle.

Operation of treating the surface of the workpiece 55 by using the sputtering system 51 of the aforesaid construction will now be described by referring to FIGS. 6 and 7. As shown in FIG. 7, the process for treating the workpiece 55 includes four steps.

In step 1 in which a temperature is raised for performing a reverse sputtering operation, the evacuating means 60 is actuated to create a vacuum of about $10^{-1}$ Torr in the vacuum reaction furnace 52 and the gas introducing means 61 is actuated to introduce $H_2$ gas into the vacuum reaction furnace 52 to create a reducing gas atmosphere and provide a treating pressure of 1-10 Torr. Then, the heater 64 is rendered operative by applying an AC voltage from the AC power source 65, to heat the workpiece 55 and raise its temperature to the treating temperature range between 300 and 570° C., preferably between 550 and 560° C., which suits discharge nitriding of the workpiece 55.

Step 2 is a reverse sputtering step in which an atmosphere of $N_2$ gas or an atmosphere of mixed gases including a mixture of $N_2$ and $H_2$, a mixture of $N_2$ and $NH_3$, a mixture of $N_2$ and inert gas, etc., is created in the vacuum reaction furnace 52 by operating the gas introducing means 61 while heating the workpiece 55 by the heater 64. When necessary, a hydrocarbon gas, such as $C_3H_8$, may be added to the atmosphere. The polarity converter 62 is actuated to make the workpiece serve as a cathode and the target 53 as an anode, and a DC voltage is applied between the cathode and anode to set up a glow discharge, to thereby purify and the workpiece 55 and perform nitriding thereon. At this time, the treating pressure is 1-5 Torrs, and nitride layer is formed on the surface of the workpiece 55 in this step.

In step 3, conversion of the polarity is effected. The polarity converter 62 is actuated to make the workpiece 55 serve as an anode and the target 53 as a cathode, and the gas introducing means 61 is actuated to create an atmosphere of $N_2$ gas, argon gas or an atmosphere of mixed gases including $N_2$ and argon, $N_2$ and $H_2$, Ar, $N_2$ and $H_2$, etc., in the vacuum reaction furnace 52, and a DC voltage is applied between the workpiece 55 and target 53. At this time, the treating pressure is in the range between $10^{-4}$ and $10^{-2}$ Torr.

Step 4 is a sputtering step in which the condition set in step 3 is maintained for a predetermined period of time to subject the workpiece 55 to sputtering treatment. In the vicinity of the target 53, the magnetic field has a magnetic intensity of about 200 Oersted. In this step, a coat of a compound of the sputtered material and the atmosphere gas or gases is deposited on the nitride layer on the surface of the workpiece 55 by vaporization deposition in the vacuum reaction furnace 52.

In the surface treating process described hereinabove, the workpiece 55 is heated by the heater 64 in step 1. By virtue of this feature, the temperature of the workpiece 55 is readily raised in a shorter period of time than if no heater were used and glow discharge alone were relied on. The use of the heater 64 enables uniformity to be achieved in the distribution of temperature in the workpiece 55, and the workpiece 55 can be maintained at a desired temperature when the glow discharge is set up in step 2.

In step 2, the temperature in the vacuum reaction furnace 52 is kept at a level suiting the reverse sputtering operation by a combination of the heater 64 and the glow discharge. Thus, the current density required for setting up the glow discharge can be reduced, thereby stabilizing the glow discharge. Assume that the temperature in the reaction furnace 52 is maintained at the reverse sputtering temperature of 500° C. only by means of a glow discharge without using the heater 64. Then, the current density required would be about 5mA/cm$^2$. However, if the combination of heater and glow discharge is used, the current density required will be about 0.5 mA/cm$^2$.

In step 1, the heater 64 alone is relied on for raising the temperature of the workpiece 55. However, if the combination of heater and glow discharge were relied on, the period of time necessary for raising the temperature to a predetermined level could be reduced.

In the embodiment shown in FIG. 6, the target 53 is located in the central portion of the vacuum reaction furnace 52 and the workpiece 55 is located outside the target 53 in a manner to surround same while the heater 64 is mounted along the furnace wall surface. The invention is not limited to this arrangement, and a plurality of targets may be located outside the workpiece in a manner to surround same and rotated about the central portion of the vacuum reaction furnace 52.

In the embodiment shown in FIG. 6, a glow discharge is set up between the workpiece 55 and target 53. However, this is not restrictive and a glow discharge may be set up between the workpiece 55 and the furnace wall. In this case, the polarity converter 62 would be constructed such that the workpiece 55 is made the cathode and the furnace body 52b is made the anode in one operation and the target 53 is made the cathode and the workpiece 55 is made the anode in another operation. Thus, when a glow discharge is set up, the workpiece 55 would be made the cathode and the furnace body 52b would be made the anode, and when sputtering is performed, the polarity converter 62 would be actuated to make the workpiece 55 the anode and the target 53 the cathode. A power source for applying a DC voltage between the workpiece 55 and furnace body 52b for setting up a glow discharge and a power source for applying a DC voltage between the workpiece 55 and target 63 for performing sputtering may be provided separately.

From the foregoing description, it will be appreciated that according to the invention the workpiece can be continuously subjected to reverse sputtering treatment and sputtering treatment in a magnetron type sputtering system, so that the strength with which the film deposited by the sputtering treatment adheres to the hardened layer of the workpiece provided by the reverse sputtering treatment can be increased. The use of a heater for raising the temperature of the workpiece enables the necessary to set up a glow discharge to be reduced, and the glow discharge thus set up can be stabilized. Even if the workpiece to be treated is complex in shape, the nitride layer formed on the surface of the workpiece has a uniform thickness over the entire area and the coat of film with uniform thickness applied by sputtering on the nitride layer adheres to the nitride layer with high bond strength.

What is claimed is:

1. A sputtering system comprising:
a vacuum reaction furnace including a furnace body;
a workpiece located substantially is a central portion of said vacuum reaction furnace;
a plurality of targets located around said workpiece along the circumference of an imaginary circle and spaced apart from the workpiece a predetermined distance, said targets being spaced apart equidistantly from each other;
rotating means connected to said workpiece for rotating same; and
magnetic field generating means located within each said target and on an outer periphery of said furnace body for generating a magnetic field between said workpiece and each said target and a magnetic field located perpendicular to said magnetic field generated between said workpiece and each said target.

2. A sputtering system comprising:
a magnetic reaction furnace including a furnace body;
a workpiece located substantially in a central portion of said vacuum reaction furnace;
a plurality of targets located around said workpiece along the curcumference of an imaginary circle and spaced apart from the workpiece a predetermined distance, said targets being spaced apart equidistantly from each other;
rotating means connected to said targets for rotating same about said workpiece; and
magnetic field generating means located within each said target and on an outer periphery of said furnace body for generating a magnetic field between said workpiece and each said target and a magnetic field located perpendicular to said magnetic field generated between said workpiece and each said target.

3. A sputtering system comprising:
a vacuum reaction furnace including a furnace body;
a workpiece and a target located in said vacuum reaction furnace;
magnetic field generating means for generating a magnetic field in the vicinity of said target;
glow discharge setting up means for setting up a glow discharge by using either said target or said furnace body as an anode and said workpiece as a cathode;
sputtering means for performing sputtering by using said target as a cathode and said workpiece as an anode;
a polarity converter for switching said target and workpiece from the cathode to the anode and vice versa; and
a heater mounted on an inner surface of said furnace body for heating said workpiece.

* * * * *